(12) United States Patent
Deveaud-Plédran et al.

(10) Patent No.: US 7,888,692 B2
(45) Date of Patent: Feb. 15, 2011

(54) SINGLE PHOTON SOURCE

(75) Inventors: Benoît Deveaud-Plédran, Lausanne (CH); Cristiano Ciuti, Sceaux (FR); François Morier-Genoud, Villeneuve (CH)

(73) Assignee: École Polytechnique Fédérale de Lausanne (CH)

( * ) Notice: Subject to any disclaimer, the term of this patent is extended or adjusted under 35 U.S.C. 154(b) by 1204 days.

(21) Appl. No.: 11/394,518

(22) Filed: Mar. 31, 2006

(65) Prior Publication Data

US 2007/0007507 A1 Jan. 11, 2007

(30) Foreign Application Priority Data

May 30, 2005 (EP) .................................. 05011604

(51) Int. Cl.
*H01L 33/00* (2010.01)
(52) U.S. Cl. .............................. 257/94; 257/96; 257/98; 257/E33.016; 257/E33.072
(58) Field of Classification Search ................... 257/94, 257/96, 98, E33.016, E33.072
See application file for complete search history.

(56) References Cited

U.S. PATENT DOCUMENTS 5,877,509 A * 3/1999 Pau et al. ...................... 257/14

| | | | |
|---|---|---|---|
| 2003/0127608 A1 * | 7/2003 | Shields et al. | 250/493.1 |
| 2004/0149982 A1 * | 8/2004 | Michler | 257/14 |
| 2005/0195873 A1 * | 9/2005 | Forrest et al. | 372/39 |
| 2005/0195874 A1 * | 9/2005 | Forrest et al. | 372/39 |
| 2006/0220000 A1 * | 10/2006 | Bennett et al. | 257/14 |

OTHER PUBLICATIONS

Bennett, A.J. et al., High-efficiency single-photon sources based on InAs/GaAs quantum dots in pillar microcavities, Physica E, Feb. 2005 (available on-line Dec. 10, 2004), pp. 391-394, vol. 26, Elsevier, Netherlands.

Bennett, A.J. et al., Microcavity single-photon-emitting diode, Applied Physics Letters, May 2, 2005 (available on-line Apr. 25, 2005), pp. 181102.1-181102.3, vol. 86, No. 18, American Institute of Physics, USA.

Dasbach, G. et al., Oscillations in the differential transmission of a semiconductor microcavity with reduced symmetry, Physical Review B (Condensed Matter and Materials Physics), pp. 245316.1-245316.6, vol. 65, No. 24, American Physical Society through American Institute of Physics, USA.

Weihs, G. et al., Exciton-polariton lasing in a microcavity, Semiconductor Science and Technology, pp. S386-S394, vol. 18, No. 10, Institute of Physics, UK.

* cited by examiner

*Primary Examiner*—Ngan Ngo
(74) *Attorney, Agent, or Firm*—Saliwanchik, Lloyd & Eisenschenk

(57) ABSTRACT

Microcavity comprising two reflectors, at least one semiconductor layer separating said reflectors and a semiconductor quantum well wherein at least one of said reflectors and of said at least one semiconductor layer comprises a structure which is adjusted to localize a polariton in said microcavity.

6 Claims, 5 Drawing Sheets

SINGLE PHOTON SOURCE

FIELD OF INVENTION

This invention generally relates to optical communication devices and in particular to a single photon source and a corresponding method.

BACKGROUND OF INVENTION

A single photon source is a light source which is adjusted to repetitively emit single photons at a specific repetition rate. It can be used e.g. in optical quantum cryptography. One way of realizing a single photon source is to attenuate a laser beam down to a level where emitted photons are statistically separated with a sufficient probability. However, such a source suffers from random fluctuations in the photon emission rate which means major drawbacks for a use as an optical telecommunication device. According to another type of single photon source an optically or electrically driven emission from a single quantum dot is used. An example of an optically driven quantum dot photon source is given in GB 2377551 A. Although single quantum dot sources are advantageous in respect of their compactness they include the drawback of a poor collection efficiency and a low repetition rate. Moreover, it is difficult to fabricate arrays of multiple quantum dots with precisely predetermined positions of the dots with present manufacturing methods such as self-assembling techniques.

It is an object of the present invention to provide a single photon source with a high collection efficiency and repetition rate and which can be manufactured with high precision and reproducibility as well as a corresponding method.

BRIEF SUMMARY OF INVENTION

According to the present invention a microcavity is provided which comprises two reflectors, at least one semiconductor layer separating said reflectors and at least one semiconductor quantum well wherein at least one of said reflectors and of said semiconductor layer comprises a structure which is adjusted to spatially localize, i.e. to produce a preferably three dimensional quantum confinement of a polariton or an optical polariton excitation, respectively, in said microcavity. The inventive microcavity allows the formation of quasi-particles called cavity polaritons, consisting of the quantum superposition of an exciton, i.e. a two-particle state of a correlated electron-hole pair in a quantum well and a photon. In order to permit the generation of polaritons the length of the cavity formed between the reflectors is such that a microcavity photonic mode with a frequency close to the emission frequency of an exciton in the quantum well is formed. Preferably the cavity length or thickness corresponds to an integer multiple of the wave length of radiation emitted by an exciton formed in the quantum well. Due to the structure of the inventive microcavity which is adjusted to localize or locally confine a polariton in at least one region thereof, the fundamental polariton energy state (the polariton state with the lowest possible energy) of the localized polariton(s) becomes blocked for the absorption of a photon with a wavelength which is resonant to the fundamental polariton energy state when the fundamental energy state is occupied preferably with a single polariton only. After the emission of a single photon within the radiative lifetime of the polariton the fundamental polariton state is free and a photon can be absorbed to newly generate a polariton.

Thus by irradiating the microcavity with a continuous or pulsed light beam a repetitive emission of single-photon pulses can be obtained. The repetition period is determined by the polariton lifetime and preferably reaches more than several tens of picoseconds.

Due to the localizing structure the renormalized single-polariton energies of two or more localized polaritons in the cavity are shifted towards higher energies with respect to the fundamental energy of a single localized polariton. In the inventive microcavity the energy shift is preferably larger than the linewidth of the emission spectrum of the photonic part of the polariton and thus the fundamental energy state of the polarition is quantum blocked when it is occupied with a single polariton. As can also be shown by calculations the energy shift towards higher energies increases with increasing localization strength, i.e. decreasing localization or confinement size of the polaritons in the microcavity.

According to one embodiment of the invention a localization of polaritons is achieved by a microcavity which comprises at least one region having a different and preferably increased cavity length than a portion of said microcavity surrounding said region. By locally changing the length of the cavity a localizing structure or "polariton trap" is realized in which polaritons are localized or spatially confined due to an energy change of the photon modes of the polariton. The localization strength and the energy shift towards higher energies of the polariton energy states increases both with a decreasing dimension of the region in which the cavity length is changed and also with the amount of the change of the cavity length, i.e. the depth of the trap.

By the microcavity structure according to this embodiment a significant localization and a reasonable energy shift of the renormalized single-polariton energies towards higher values (i.e. an energy blue shift) is achieved without reducing or negatively influencing the polariton lifetime. In general, a localization of polaritons in a microcavity structure can also be achieved by reducing the lateral dimensions of the microcavity, e.g. by an etching process. However, due to the interaction of the excitonic part of the polariton with the outside of the microcavity (e.g. the surrounding air) polaritons in such a structure exhibit a reduced lifetime which in turn results in a broadened linewidth of the emission spectrum of the photonic part of the polariton. This counteracts or cancels the quantum blocking effect of the fundamental energy state, if the broadening of the spectral linewidth is large enough so that an overlap between the renormalized single-polariton state of each polariton in the case of two or more polaritons in the localized state and the single polariton state for only one localized polariton occurs. In this case photons are absorbed even when the fundamental polariton state is occupied and a quantum blocking effect of the fundamental polarition resonance cannot be achieved.

According to a further embodiment a local change of the length of the cavity can be achieved by providing at least one reflector and/or semiconductor layer in said cavity which comprises a raised or recessed region in one of the surfaces and preferably in one of the surfaces which are oriented perpendicular to the longitudinal dimension of the microcavity_to locally change and preferably increase the length of the cavity in that region. Such a structure can be fabricated by lithographic and etching techniques commonly used in semiconductor technology. It is preferred to obtain a cavity with a locally modified length by preparing a spacer layer of the microcavity with a raised region on top of which further semiconductor layers e.g. of a Bragg mirror are grown. According to a preferred embodiment at least one of said reflectors is a Bragg reflector including a sequence of alternating semiconductor layers having different band gaps. Bragg reflectors can conveniently be produced using well known semiconductor fabrication technologies. The raised region in the spacer layer is preferably transferred to the semiconductor layers of the Bragg reflector subsequently grown on top of it. Alternatively a raised or recessed region could be formed in one of the layers of the Bragg reflector. In addition, it can also be taken into account to provide a layer including a raised or projecting region on both sides of the microcavity with the raised structures oppositely oriented towards the respective end of the microcavity.

The raised or recessed region can comprise a circular, polygonal or elliptical shape. It preferably includes a width and/or length of less than 5 μm, preferably of less than 2 μm and particularly preferred of less than 1 μm and a height or depth of more than 1.5%, preferably of more than 5% and particularly preferred of more than 10% of the cavity length for a microcavity based on GaAs and AlGaAs. It may vary for other materials. The polariton lifetime and thus the repetition rate of the photon emission from the cavity can be controlled by appropriately predetermining the dimension or diameter and height of the raised or recessed region.

The microcavity as well as the layer including a raised or recessed region is preferably produced with semiconductor growth and lithographic processing techniques such as molecular beam epitaxy (MBE) or metal organic chemical vapors deposition (MOCVD) or others. Suitable materials for the microcavity include III-V semiconductors such as GaAs and AlGaAs.

Since the fabrication process of the microcavity can be based on known lithography techniques it is well controllable and the microcavities are reproducible to a very high degree. Contrary to self-assembling techniques which are frequently used for the fabrication of quantum dots, it is possible to fabricate integrated arrays including a large number of localizing microcavity regions and of single-photon emitters having precisely defined positions. The raised region which is preferably transferred to the top layer of the cavity and thus identifiable can be used for alignment purposes of the microcavity with other devices such as an optical fiber.

The inventive microcavity can be integrated in a photon source. Such a device preferably includes a light source. Such as a continuous or pulsed laser which is adjusted to emit radiation onto the microcavity at a wavelength which is resonant or slightly red shifted with respect to the fundamental resonance of a polariton in said microcavity. The photon source is preferably used as a highly efficient single photon emitter having a collection efficiency preferably of more than 50% and particularly preferred of close to 100%. The repetition rate of a corresponding device can be increased up to 10 GHz.

According to the present invention also a method of a single photon emission and of fabricating a single photon emitter, respectively, is provided. It includes the step of producing a microcavity comprising two reflectors, at least one semiconductor layer separating said reflectors and at least one semiconductor quantum well, wherein least one of the layers of the microcavity comprises a structure which is adjusted to localize a polariton in said microcavity. In addition the method includes the step of irradiating laser light on said microcavity at a wavelength which is resonant or slightly red shifted with respect to the fundamental resonance of a polariton in said microcavity. Preferably a cooling means such as a cryostat is provided to cool the microcavities to an appropriate temperature. Preferred temperatures are below 273 K, below 70 K or below 2K.

Due to the localization of a polaritons in the microcavity according to the inventive method an energy shift of the renormalized fundamental polariton-energies towards higher energies in the case of more than one polariton occupying the localizing structure of the microcavity is obtained. Thus a quantum blocking effect which prevents a absorption of photons with a wavelength which is resonant with the fundamental energy state of a single localized polariton in the microcavity is achieved. By irradiating the microcavity with a wavelength which is resonant with the fundamental single-polariton energy state, a single photon absorption process is produced. Thereupon, within the lifetime of the polariton, a single photon emission process with a repetition rate corresponding to the lifetime of the localized polariton follows. It becomes possible to obtain a beam of single photons with a high repetition rate of preferably up to 10 GHz and a collection efficiency close to 100%.

According to one embodiment the microcavity is formed with at least on region which comprises a different cavity length than a portion of said microcavity surrounding said region. Due to the local change of the length of the cavity a polariton can be localized without reducing or negatively influencing its lifetime and the spectral linewidth of its photonic part. The depth of the "potential trap" for the polaritons is directly determined by the change of the length of the cavity.

Preferably the step of producing the microcavity includes forming at least one of said reflectors and said semiconductor layers with a raised or recessed region in one of their surfaces to change the length of the microcavity in said region. This step can be performed by lithography techniques using a stop etch layer.

According to another embodiment the method includes an emission of single photons with a repetition rate of more than 10 GHz preferably of more than 20 GHz and particularly preferred of more than 100 GHz.

BRIEF DESCRIPTION OF DRAWINGS

Further aspects and objects of the present invention will result from the following description of a preferred embodiment of the invention in conjunction with accompanying drawings, in which.

DETAILED DISCLOSURE

Figure 1:
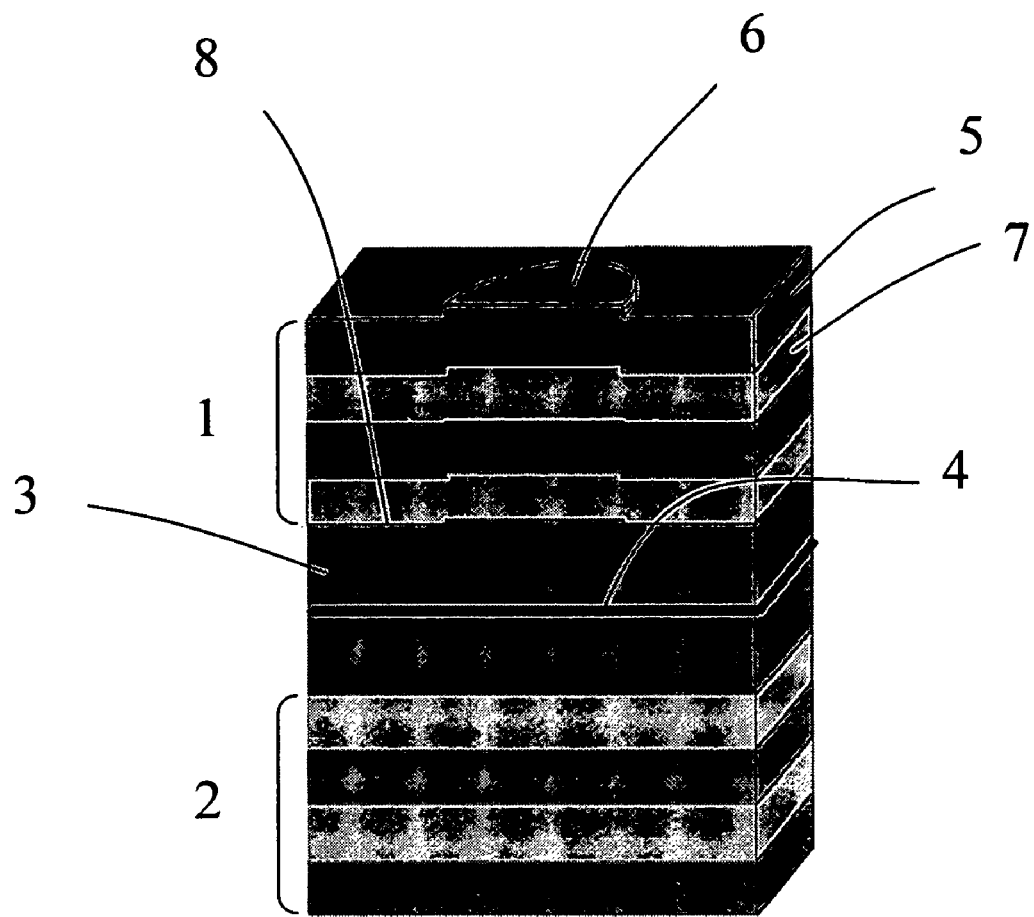
FIG. 1 shows the structure of an example of the inventive microcavity according to one embodiment.

FIG. 1 shows an example of a microcavity comprising two Bragg reflectors 1, 2 formed of alternating layers 5, 7 of GaAs and AlAs. The Bragg reflectors 1, 2 are separated by two semiconductor layers 3 of GaAs that surround a single quantum well of $In_{0.04}Ga_{0.96}As$. Its fundamental energy level corresponds to a wavelength of 835 nm. The distance between the Bragg reflectors corresponds to this wavelength. Therefore, the formation of a polariton, i.e. the superposition of a photon and an exciton in the microcavity is granted. The semiconductor layers are sequentially grown on a substrate (not shown) using molecular beam epitaxy (MBE). For the purpose of illustration only a reduced number of the semiconductor layers of the actually grown microcavity and of the semiconductor layers forming the Bragg reflectors 1, 2 are shown. The Bragg reflectors each comprise a reflectivity of more than 99.5%. The microcavity can also include more than one quantum well, wherein the number of quantum wells is not critical for the invention.

Figure 2:
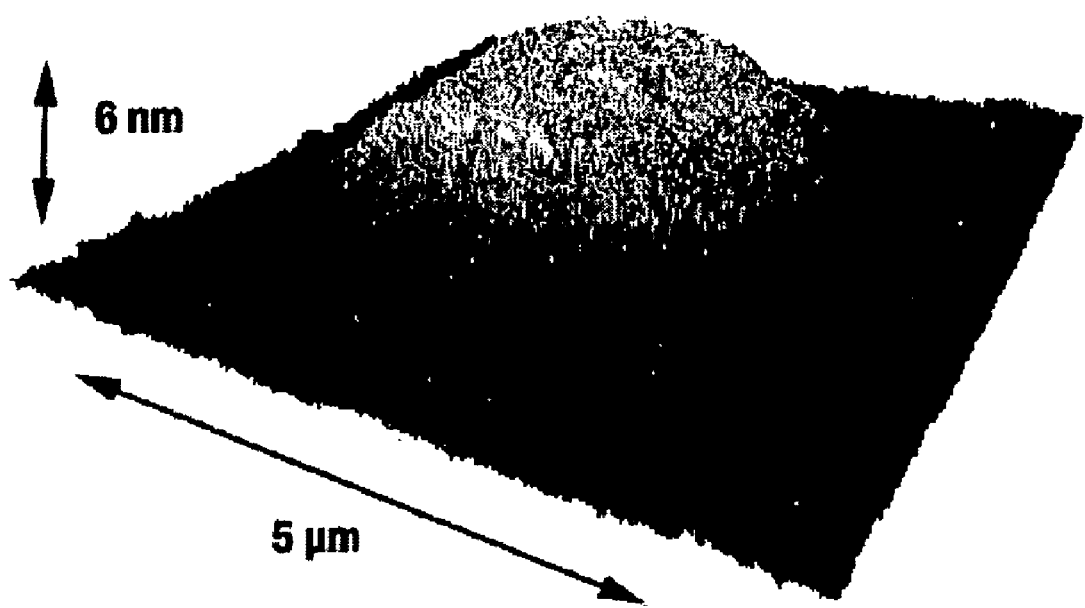
FIG. 2 shows an AFM image of a layer of the microcavity of FIG. 1.

As it is visible in FIG. 1, the semiconductor layer 3 which is positioned on top of the InGaAs quantum well includes a raised region 6 in its upper surface 8. The raised portion 6 is prepared by a masking and etching technique including a stop edge spacer layer. Since additional semiconductor layers which are e.g. part of the Bragg reflector 1 are subsequently grown on the semiconductor layer 3 the thickness change in the region 6 is transferred through all subsequent layers and in the topmost layer. FIG. 2 shows an atomic force microscope (AFM) characterization of an actually prepared sample and in particular of a spacer layer 3 before applying layers of a Bragg reflector. The raised area or mesa structure has a width of about 5 μm and a height of 6 nm and comprises an approximately hemispherical shape. Since this structure appears on the surface of the topmost layer or the microcavity, a proper alignment of the sample is facilitated. The lateral dimension of the microcavity (perpendicular to the cavity lenght) is about 100 μm. However, this value is not critical as long as it is significantly larger than the size of the localizing structure or "polariton trap".

Due to the raised region in the otherwise flat surface of the spacer layer 3 and also in the Bragg reflector 1, the length of the cavity locally changes. The local change of the length of the cavity results in a local trap for polaritons and thus, in an energy shift of the renormalized single-polariton energies towards higher energies in the case in which more than one polariton populate the microcavity. Since the lateral extension of the microcavity has been determined sufficiently large an interaction of the trapped polariton(s) with the area outside the microcavity can be strongly reduced or excluded. Therefore, no reduction of the polariton lifetime and thus no detrimental broadening of the linewidth occurs and the absorption of a laser beam with a frequency which is slightly red shifted or resonant with the fundamental energy state of the polariton in the microcavity is blocked. This effect appears in the case when only one polariton is trapped in the cavity, but also for a number of more than one polariton in the microcavity. After the emission of a photon within the polariton lifetime a further photon of the resonant beam can be absorbed.

Figure 3A:
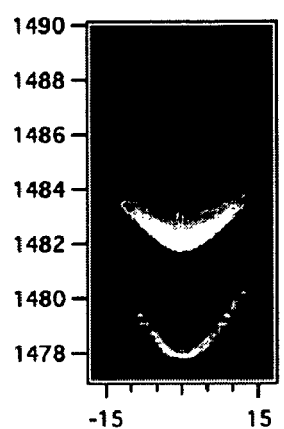
FIG. 3(a)-(c) shows the k-space emission from microcavities according to different samples of one embodiment of the present invention including trap sizes of 20 (FIG. 3a), 10 (FIG. 3b), and 3 (FIG. 3c) μm, respectively.
Figure 3B:
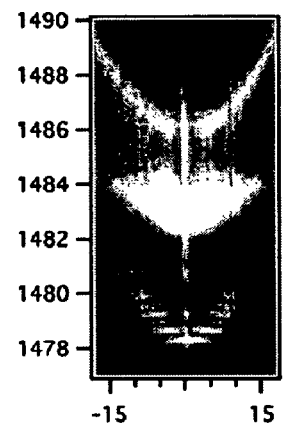
Figure 3C:
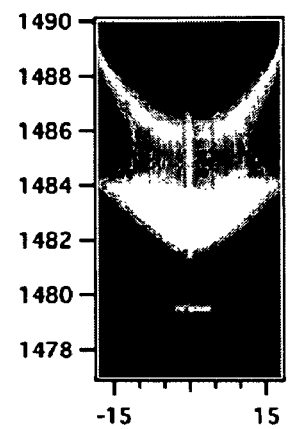

FIG. 3*a*-*c* show images of the reciprocal space (k-space) of microcavities including a structure according to the embodiment shown in FIG. 1 with raised regions or polariton traps of 20, 10 and 3 μm, respectively, and a height of the structure (or trap depth) of 6 nm obtained by Fourier imaging of the microcavity emission. The exitation spot of the used laser was 100 μm in diameter and thus larger than the trap sizes.

Figure 4:
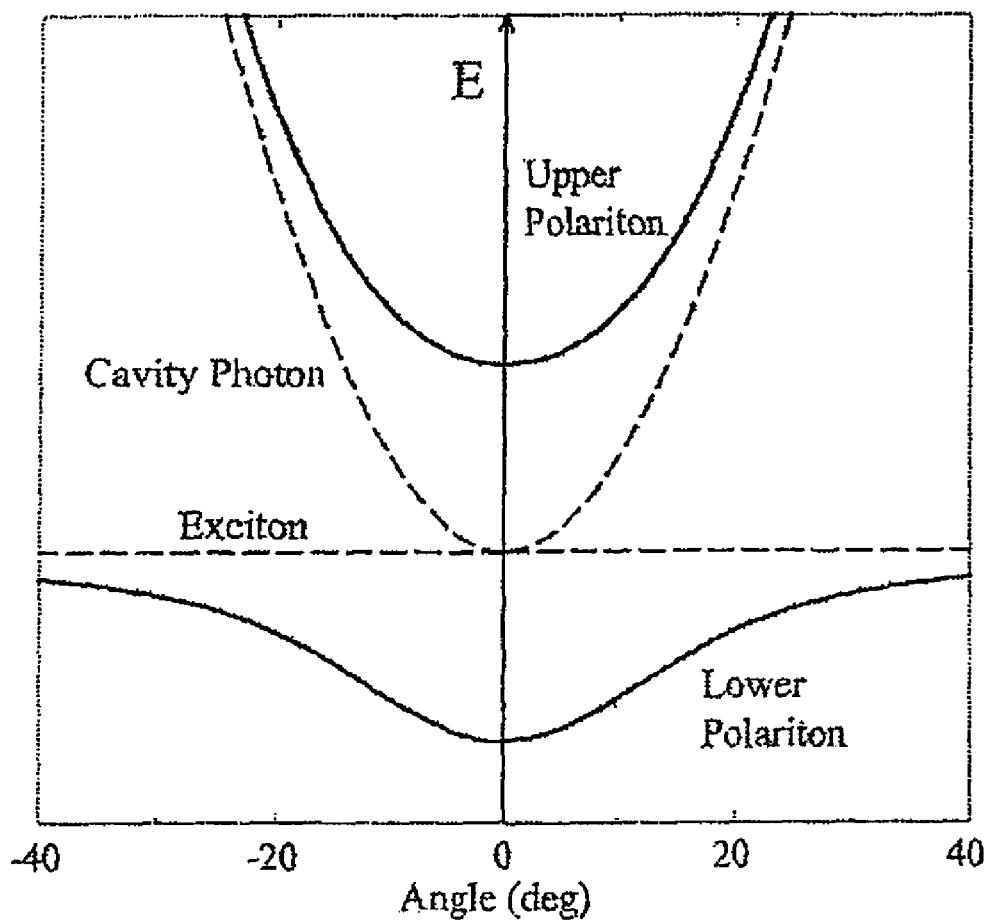
FIG. 4 a diagram showing the dispersion of a common microcavity polariton.

In the case of the smallest trap size (FIG. 3*c*) quantized polariton energy levels can be observed between 1479 and 1482 nm due to the energy shift of the renormalized polariton energies. The lowest energy state corresponds to a polariton deeply trapped in the microcavity and shows a linewidth of less than 100 μeV, which corresponds to a polariton lifetime of the order of 10 ps. No overlap between the spectral lines of the quantized polariton energy states is observed. Due to the used spot size with a diameter of 100 μm both polaritons outside the trap and the polaritons in the trap are observed. Correspondingly to the polaritons outside the trap a standard disperson curve corresponding to a microcavity without a localizing structure is observed in the spectrum at wavelengths above 1482 nm. This dispersion basically corresponds to the theoretical curve for a microcavity without any localizing structure shown by the unbroken lines in FIG. 4. The dispersion curve in FIG. 4 shows a degeneration of the energy states at the crossing point of the parabola like dispersion curve of photon in the cavity and the straight dispersion of an exciton in the quantum well (dashed lines).

In the case of larger traps (FIGS. 3*a* and 3*b*) the quantum blocking effect cannot be observed, due to a smaller localization effect and an insufficient energy shift of the renormalized energies which is equal or less than the spectral linewidth of the polariton.

Calculations showed that the condition for the observation of the quantum blocking effect is given by the relation $$g \times (2/L^2) > \gamma \tag{1}$$

wherein $g \times (2/L^2)$ is the energy shift of the renormalized single-polariton energy in the case of two localized polaritons in a microcavity, g is a nonlinear constant due to exciton-exciton interactions and is of the order of 0.05 meV μm² for GaAs. L is the dimension of the localizing region and γ is the linewidth of the photonic part of the polariton, i.e. the polariton lifetime.

According to these calculations a blueshift of the order of 100 μeV for a trap size of the order of one micron was obtained for the GaAs sample described above. It has been confirmed by these calculations that the dynamics of a polariton trap with a size around or below 1 micrometer becomes strongly non-linear already for one single polariton and that the light emission becomes highly non-classical.

Figure 5:
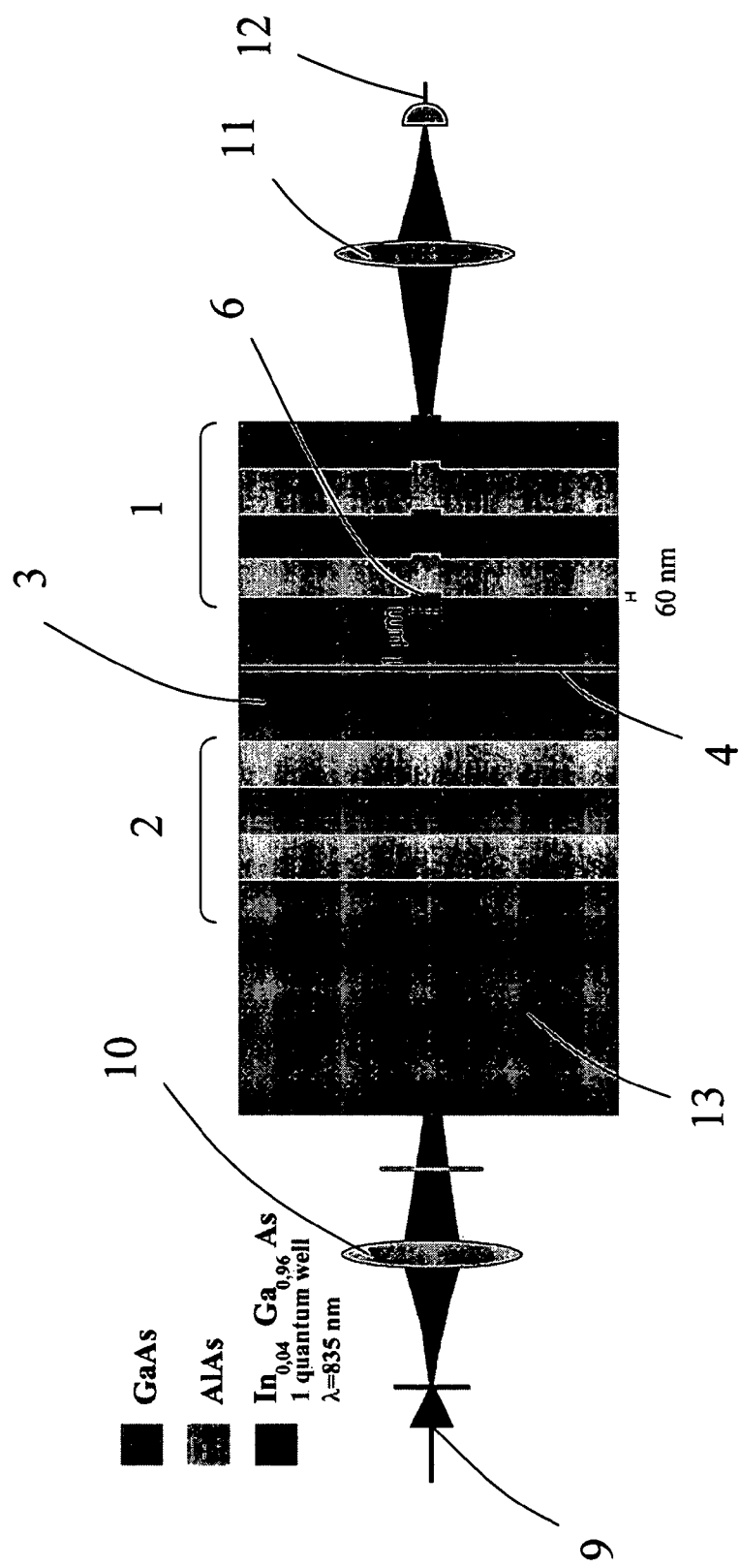
FIG. 5 shows an example of a single photon emitting device including a microcavity structure according to the embodiment shown in FIG. 1.

FIG. 5 shows an example of a single photon emitting device including a microcavity according to the present invention. The device includes a microcavity with basically the same structure as the microcavity shown in FIG. 1. In addition a substrate 13 is shown on top of which the microcavity is grown. Collinear with the longitudinal direction of the microcavity, a laser diode 9 is provided which serves as an excitation source for the emission of single photons. Between the laser diode and the substrate an interference filter is arranged to select a single wavelength of the spectrum emitted by the laser diode. Also, collinearly with the microcavity a collecting lens 11 and an optical fiber are arranged to collect and guide single photons emitted from the microcavity. As an excitation source a continuous or pulsed laser diode can be used. The microcavity is preferably adapted to achieve a quantum blocking effect a thus a beam of single photons as described above.

The power of the exciting beam has to be chosen sufficiently low, since the number of absorbed polaritons shows a staircase-like behavior as a function of the resonant laser pump intensity and thus increases with increasing power of the exciting beam independent from the quantum blocking phenomenon. In order to keep the resonant character of the excitation a pulsed laser with a spectral width, which is comparable or smaller than the polariton line width can be used. In the case of the microcavity shown in FIG. 4*c* a linewidth of 100 μeV was observed. Thus a resonant excitation could be achieved with a laser spectrum width of 30-50 μeV which leads to the emission of single-photon pulses out of the localizing region of the microcavity. The repetition period is limited only by the pulse duration. For the sample shown in FIG. 4*c* it was of the order of a few ten picoseconds. This corresponds to a repetition rate of more than 100 GHz.

The device shown in FIG. 5 can be easily integrated into an array of emitters which preferably includes multiple localization regions (polariton traps) in one microcavity sample. Such a multiple emitter array could be fabricated by a single fabrication process using semiconductor lithography techniques and combined with an appropriate number of optic fibers into an optical telecommunication device.

The above example refers to a sample based on GaAs and AlGaAs and a single photon beam in the wavelength region of about 1480 nm. However, the present invention can also be applied to other materials and wavelengths without departing from its concept.

The features disclosed in the description, the claims and the drawings can be of importance for the present invention either alone or in any combination thereof.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A photon emitting device, comprising:
    a microcavity, wherein the microcavity comprises:
        two reflectors;
        at least one semiconductor layer separating the two reflectors; and
        a semiconductor quantum well,
            wherein at least one of the two reflectors and of the at least one semiconductor layer comprises a structure that is adjusted to localize a polariton in the microcavity; and
    a light source, wherein the light source is adjusted to emit radiation onto the microcavity at a wavelength that is resonant or slightly red shifted with respect the fundamental resonance of a polariton in the microcavity.

2. The photon emitting device according to claim 1, wherein the microcavity comprises at least one region having a different cavity length than a portion of the microcavity surrounding the region.

3. The photon emitting device according to claim 1, wherein at least one of the two reflectors and of the at least one semiconductor layer comprises a raised or recessed region in one of their surfaces to change the length of the microcavity in the region.

4. The photon emitting device according to claim 1, wherein the length of the cavity formed between the two reflectors is such that a microcavity photon mode with a frequency close to the emission frequency of an exciton in the quantum well can be formed.

5. The photon emitting device according to claim 1, wherein at least one of the two reflectors is a Bragg reflector including a sequence of alternating semiconductor layers having different band gaps.

6. The photon emitting device according to claim 2, wherein at least one of the two reflectors and of the at least one semiconductor layer comprises a raised or recessed region in one of their surfaces to change the length of the microcavity in the region.

* * * * *

UNITED STATES PATENT AND TRADEMARK OFFICE
CERTIFICATE OF CORRECTION

| | | |
|---|---|---|
| PATENT NO. | : 7,888,692 B2 | Page 1 of 1 |
| APPLICATION NO. | : 11/394518 | |
| DATED | : February 15, 2011 | |
| INVENTOR(S) | : Benoit Devaud-Pledran et al. | |

It is certified that error appears in the above-identified patent and that said Letters Patent is hereby corrected as shown below:

Column 2,
Lines 56-57, "microcavity_to" should read --microcavity to--.

Column 3,
Line 40, "source. Such" should read --source such--.
Line 55, "wherein least" should read --wherein at least--.

Column 4,
Line 16, "with at least on" should read --with at least one--.

Column 5,
Line 24, "lenght)" should read --length)--.

Column 8,
Line 3, "with respect the" should read --with respect to the--.

Signed and Sealed this
Fifth Day of July, 2011

David J. Kappos
*Director of the United States Patent and Trademark Office*